United States Patent
Gassmann

[11] Patent Number: 5,231,346
[45] Date of Patent: Jul. 27, 1993

[54] FIELD STRENGTH MEASURING INSTRUMENT FOR THE SIMULTANEOUS DETECTION OF E AND H FIELDS

[75] Inventor: Felix Gassmann, Zürich, Switzerland
[73] Assignee: Asea Brown Boveri Ltd., Baden, Switzerland
[21] Appl. No.: 833,793
[22] Filed: Feb. 12, 1992
[30] Foreign Application Priority Data
Feb. 25, 1991 [CH] Switzerland ............... 563/91
[51] Int. Cl.⁵ ............ G01R 31/02; G01R 23/04; G01R 25/02; G01R 27/02
[52] U.S. Cl. ............................. 324/95; 324/72
[58] Field of Search .......... 324/95, 72, 72.5, 158 P, 324/258; 343/739, 741, 846; 455/67

[56] References Cited

U.S. PATENT DOCUMENTS

| | | | |
|---|---|---|---|
| 2,785,396 | 3/1957 | Carter | 343/741 |
| 4,277,744 | 7/1981 | Audone et al. | |
| 4,328,461 | 5/1982 | Butters et al. | |

FOREIGN PATENT DOCUMENTS 0246544 11/1987 European Pat. Off. .

OTHER PUBLICATIONS

IEEE Transaction On Electromagnetic Compatibility, vol. EMC-26, No. 3, Aug. 1984, pp. 102–110, M. Kanda, "An Electromagnetic Near-Field Sensor for Simultaneous Electric and Magnetic-Field Measurements".

Fifth IEEE Pulsed Power Conference, Arlington, VA, Jun. 10–12, 1985, pp. 381–384, A. Kuchler, et al., "Combined E-and H-Field Probe for Traveling Wave Analysis in Pulse Power Generators".

IEEE Transaction On Instrumentation And Measurements, vol. IM-32, No. 4, Dec. 1983, pp. 466–468, K. Munter, "An Isolated Sensor Determining the Poynting Vector in the Near Field of a Radiating Antenna".

Primary Examiner—Walter E. Snow
Attorney, Agent, or Firm—Oblon, Spivak, McClelland, Maier & Neustadt

[57] ABSTRACT

A field strength measuring instrument for simultaneously measuring E and H fields is described. A loop antenna is formed by a half-loop (1) which is terminated by a metal surface (2). Due to the mirror effect of the metal surface (2), this arrangement, in field theory, is equivalent to a loop antenna which is divided into a first and a second half-loop (1, 5) by two load resistors (4a, 4b) arranged at opposite ends of the loop antenna. A circuit (8) for determining the field strengths of the E and H fields by means of the voltages ($V_1$, $V_2$) measured across the load resistors (4a, 4b) is arranged in a part-space shielded from the first half-loop (1) by the metal surface (2).

12 Claims, 3 Drawing Sheets

FIELD STRENGTH MEASURING INSTRUMENT FOR THE SIMULTANEOUS DETECTION OF E AND H FIELDS

BACKGROUND OF THE INVENTION

1. Field of the Invention

The invention relates to a field strength measuring instrument comprising a loop antenna which is suitable for the simultaneous detection of E and H fields and which is divided into a first and a second half-loop by two load resistors arranged at opposite ends of the loop antenna, and comprising a circuit for determining the field strengths of the E and H fields by means of the voltages measured across the load resistors.

2. Discussion of Background

It is relatively easy to determine electro-magnetic fields at a great distance from the radiation source. In contrast, the knowledge of the near fields of the radiation source to be investigated is of much greater significance for assessing the electromagnetic compatibility (EMC) and the biological effects. This is because the probability is much higher that these fields contain inadmissible field strength peaks. However, they are also characterized by extremely complicated field structures both with standing and with propagating waves, irregular surfaces of equal phase and the like. In such fields, the Poynting vector cannot be directly derived from the magnitude of the electrical or magnetic field alone.

It is generally assumed that the susceptibility of equipment to interference from electromagnetic fields or the possibility of biological hazard is dependent on the field strength occurring. For example, the heating of lossy dielectrics (for example human tissue) and the associated risk of damage is proportional to the temporal mean value of the amount of the electric field strength squared. Similarly, the heating of partially conductive materials is proportional to the temporal mean value of the amount of the magnetic field strength squared.

Since the conventional field strength measuring instruments operate with antennas which are relatively sensitive to direction, the complicated near fields cannot be reliably measured. In addition, these measuring instruments are restricted to measuring either only the E or only the H field which, for the above reasons, is not sufficient for characterizing near fields.

A very elaborate active sensor system which, in principle, is suitable for near-field measurements, is known from the article An isolated sensor determining the Poynting vector in the near field of radiation antenna, Klaus Münter, IEEE Trans. on Instr. and Measurement, Vol. IM-32, No. 4, Dec. 1983. A measuring head comprises dipoles and magnetic loops for all three planes (x, y, z). The total of six signals (three dipoles, three magnetic loops) are amplified in parallel and converted to an intermediate frequency of 100 kHz by means of six parallel mixers. A 1-from-6 multiplexer serially switches the signals onto a similarly integrated optolink. A control device receives the optical information and forwards the signals to a vector analyzer. A computer can then be used for spatially representing E and H vector, and thus also the Poynting vector.

The system just described operates at frequencies of 500 kHz to 10 MHz and has a maximum sensitivity of 0.2 V/m and 500 mA/m. The upper limit is 50 V/m. At higher field strengths, disturbances were observed in the computer system. Since this system only processes the fields by narrow-band means, the frequency to be measured must be known. It is not possible here to measure two superimposed fields at the same time.

A wideband system for simultaneously measuring E and H field components under near-field conditions is described in the publication An electromagnetic near-field sensor for simultaneous electric and magnetic-field measurements, Motohisa Kanda, IEEE Trans. on Electromagnetic Compatibility, Vol. EMC-26, No. 3, August 1984. A loop antenna which is divided by two identical load resistors at two diametrically opposite ends is used as sensor. To determine a component, predetermined by the antenna orientation, of the E or H field, the voltages are measured across the two load resistors. To be able to measure the two voltages simultaneously without introducing any loops causing interferences with the measurements, the antenna is constructed in the manner of a thick rectangular frame, in the tubular interior of which the measuring electronics are housed.

Although the device by Kanda allows arbitrarily superimposed fields to be measured, it is restricted to measuring a predetermined directional component of the E or H field, for constructional reasons. Thus, it is not possible to measure all three components of the field vectors at the same time. In addition, it is rather large and unmanageable.

SUMMARY OF THE INVENTION

It is the object of the invention to specify a field strength measuring instrument of the type initially mentioned, which measures over a wide bandwidth and is small and manageable.

According to the invention, the solution consists in that, in a field strength measuring instrument of the type initially mentioned, the second half-loop is replaced by a metal surface terminating the first half-loop, in such a manner that the first half-loop, together with its mirror image generated by the metal surface in accordance with field theory, forms a closed loop antenna, and in that the circuit is arranged in a part space shielded from the first half-loop by the metal surface.

The advantage of the arrangement according to the invention consists in that the voltages can be measured simultaneously across the two load resistors without interfering induction loops being formed by the electrical conductors needed for picking off the voltage and by the measuring electronics. At the same time, the circuit itself is also shielded by the metal surface and is thus not in danger of being impaired or destroyed by the electromagnetic field. It is also not capable of interfering in any way with the field to be measured.

With regard to design, the first half-loop is preferably led through the metal surface with an insulated feed-through on both sides and connected to the metal surface via the load resistors arranged in the shielded part-space.

When the metal surface forms a curved surface closed in itself, which encloses the shielded part-space on all sides, the field strength measuring instrument according to the invention represents a mobile and manageable test instrument which, for example, is suitable for measuring electromagnetic fields in the vicinity of broadcast transmitters.

To ensure optimum detection, the first half-loop should essentially form a part-section (particularly one half) of a circle or of a regular polygon.

It is especially advantageous if the two load resistors are essentially of the same size and have resistances of between 50 and 1000 ohms, particularly between 100 and 300 ohms, since then the voltages to be measured are of the same order of magnitude. This is because the processing of voltages is particularly easy from the point of view of measurement if they differ by less than one decade.

To compensate for the inductive characteristic of the loop antenna, a first-order low-pass filter with an input impedance which is large compared with the load resistance and a C section divided into a plurality of parallel part-capacitors is provided for picking off a voltage present across a load resistor.

To achieve a particularly preferred three-dimensional isotropic field strength measuring instrument, the metal surface is constructed as spherical surface and exhibits three identical half-loops which are orthogonally aligned in pairs, in such a manner that E and H field can be vectorially determined at the same time.

To be able to ensure a linear frequency response in the entire frequency band, the half-loops should each enclose an area which is not larger than half the effective cross-section of the surface area of the sphere. In addition, the diameter of the sphere should be smaller than half, especially less than or equal to one tenth, of the smallest wavelength of the E or H field to be measured.

According to a particularly simple and lightweight embodiment, the first half-loop is a wire-shaped structure having a diameter of more than 0.1 mm, particularly of at least 1 mm.

A stable design is obtained if the first half-loop is a conductor track applied to an insulating circuit board.

A first half-loop in the form of one half of a square is particularly advantageous because it can be easily simulated and correspondingly simply dimensioned (with respect to the desired signal levels).

Further advantageous embodiments can be obtained from the totality of dependent patent claims, particularly from suitable combinations of the individual abovementioned features.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein FIGS. 1a, b show the principle of the loop antenna according to the invention.

The reference symbols used in the drawings and their meaning are summarized in the list of designations. In principle, like parts are provided with like reference symbols in the figures.

DESCRIPTION OF THE PREFERRED EMBODIMENTS

Figure 1A:
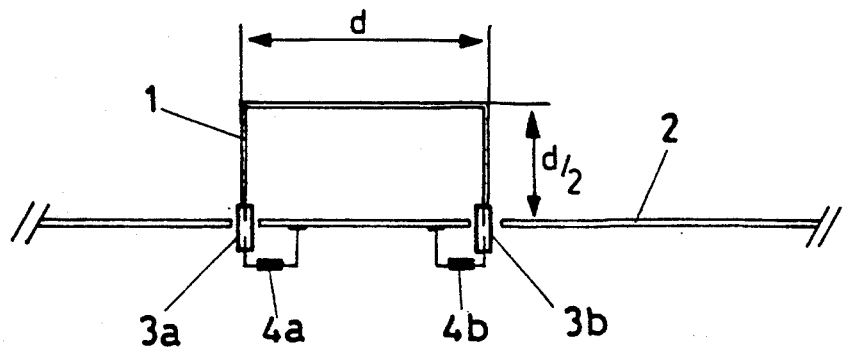

Referring now to FIG. 1a, b, the principle of the invention will first be explained. Figure 1a shows the loop antenna according to the invention. It comprises a first, bow-shaped half-loop 1 which is terminated by a metal surface 2. The two ends of the half-loop 1 are passed through the metal surface 2 (coaxial feedthroughs 3a, 3b) and connected to the metal surface 2 by means of two load resistors 4a, 4b. In principle, the metal surface 2 can be considered as an infinite plane which divides the space into two part-spaces. The so-called external space is the part-space in which the electromagnetic field to be measured, and thus also the first half-loop 1, is located. The so-called internal space is the second part-space, shielded from the field to be measured by the metal surface.

Figure 1B:
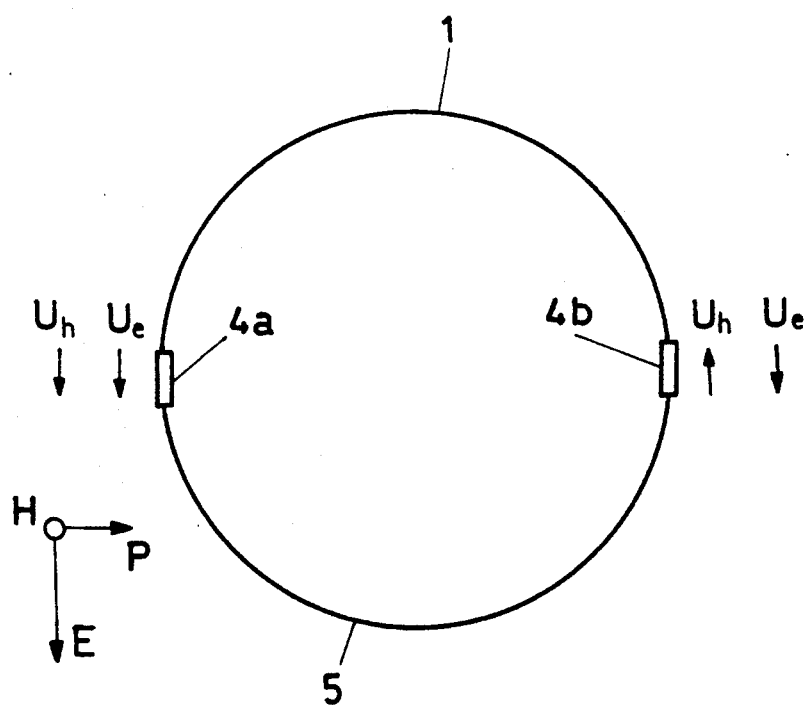

From a field theory point of view, the metal surface 2 mirrors the first half-loop 1 and thus simulates a second half-loop 5, as it were (FIG. 1b). Together, the first half-loop 1 and its mirror image form a closed loop antenna which is electromagnetically equivalent to that shown in FIG. 1b. The principle of this loop antenna consists in that the insertion of the two load resistors 4a, 4b makes it possible to separate the electrical influence from the magnetic influence completely and in a defined manner.

The separation of the influences can be illustrated for the case of an ideal transverse electromagnetic field (plane wave). In this context, the E field is to be parallel to the plane of the loop antenna (plane of the drawing), perpendicular to the diameter connecting the two diametrically opposite load resistors 4a, 4b. The H field is to be perpendicular to the E field and perpendicular to the plane of the loop antenna (that is to say perpendicular to the plane of the drawing). The Poynting vector is thus parallel to the diameter of the loop antenna connecting the two diametrically opposite load resistors 4a, 4b.

The directions described are drawn in conventional notation in FIG. 1b. E designates the component of the electrical field and H that of the magnetic field and P designates the Poynting vector ($P = E \times H$).

A voltage $U_e$ which arises from the so-called dipole mode of the loop antenna is superimposed on the circulating current induced by the H field (which leads to a voltage $U_h$ across the load resistors). Due to the balanced arrangement of the (resistive) load resistors 4a, 4b, the two voltages $U_e$ and $U_h$ add to form a voltage $V_1$ at one load resistor 4a whilst they are subtracted from one another to form a voltage $V_2$ at the other one. It is thus clear for this simple case that the influences of E and H field can be separated from one another.

To prove that the principle will function for all cases occurring, particularly for near-field conditions, however, the sensor voltages need to be calculated in a general manner. This was also done and it was possible to show analytically that, in the end, the above considerations also apply to an arbitrarily polarized wave which impinges on the loop antenna from an arbitrary direction: the sum of the voltages formed across the two loads only depends on the fundamental mode, that is to say on the magnetic field component, whereas the difference only depends on the dipole mode and thus on the electrical field component.

To be able to estimate the quantitative influence of the E and H fields on the loop antenna, numeric calculations were carried out. The calculations were based on a square loop having an edge length of 10 cm and a wire diameter of 1 mm.

The calculations firstly showed in the frequency band from 1 to 100 MHz that the voltages $V_1$, $V_2$ across the load resistors rise at 20 dB per decade and thus behave like a first-degree inductance with respect to frequency. A flattening of the ideal rise commenced at about 30 MHz, that is to say when the antenna can no longer be approximated as being electrically short ($\mu 1/10$ of the wavelength). At 1 MHz, the signal voltages were within the range of 1 mV and at 100 kHz they are only within a range of 100 $\mu V$. Increasing the dimension of the loop increases the signal voltages overall but the frequency response already begins to flatten in an unwanted manner at relatively low frequencies.

During the calculations, the load resistors were also varied. It was possible to find that with the geometric parameters of the present sample calculation, a critical value for the load exists between 50 and 200 ohms, at which the sum and the difference of the voltages $V_1$ and $V_2$ are of approximately equal magnitude. Further calculations have shown that the value of the critical load depends on the dimensions of the loop and remains approximately constant within the linear frequency range. Thus, the magnetic and the electrical signal response of the sensor can be selectively influenced by the choice of load.

On the basis of the calculations, the conditions are advantageous with load resistors of about 1000 ohms. The signal levels are approximately within the same range (that is to say they differ by less than 1 decade), the minimum signal voltage (at 75 kHz and 10 V/m) being greater than in the case of the other load resistor values. In practice, however, such high-impedance terminations would not be optimum due to the stray capacitances. For this reason resistance values within a range from 100-300 ohms are therefore especially preferred.

Whilst the abovementioned analytical proof was presented on the basis of a circular loop antenna, the above quantitative calculations were based on a square loop shape (for the sake of simplicity). In this connection, the square was considered to be the simplest approximation to the circle. However, it has been found in symmetrical, that is to say polygonal loops, that the shape has qualitively no influence and quantitively only a negligibly small influence on the voltage variations.

With respect to the symmetry or the shape of the loop, it must be pointed out that the influence of the H field depends on the area and that of the E field depends on the "height" of the loop. What is meant here by "height" is the length of the projection of the loop on a straight line parallel to the E field (according to FIG. 1b). Thus, if the loop is severely unsymmetrical (that is to say if it has, for example, the shape of a long narrow rectangle), the desired linearity in the frequency response of the voltages $V_1$, $V_2$ is lost.

In principle, the loop antenna reaches the limit of its capabilities when the curvature of the wave front is no longer negligible compared with the loop diameter. It is therefore of importance, especially for near-field measurements, to keep the extent of the sensor as small as possible. This provides a quasi-point-shaped field information and suppresses the influence of the wave front curvature. It is therefore recommended to choose the equivalent loop diameter to be no larger than 10 cm for a frequency band from 75 kHz to 30 MHz.

The analytical and numeric calculations were carried out on the basis of the equivalent loop antenna according to FIG. 1b. For reasons of field theory, however, they also apply to the embodiment according to the invention (FIG. 1a) with the terminating metal surface. The results can even be adopted directly for the ideal case of the infinitely large plane metal surface. The validity must be proven for the preferred case of a curved surface closed in itself. This was also done, using the spherical metal surface as an example.

Due to the complexity of the dependencies between loop geometry and field influences, however, it is not easily possible to uncover the relationships discussed above. However, it was possible to find that no standing waves occur on the surface when the diameter of the sphere has been suitably selected ($<\frac{1}{2}$ of the wavelength). The lower signal levels due to the curved metal surface do not represent any fundamental problem since they can be raised again by enlarging the loop geometry (particularly of the loop area).

To obtain a point-shaped field information, the sphere should be as small as possible. On the other hand, the half-loop should not be too large compared with the sphere but should, nevertheless, lead to detectable voltage amplitudes. Given these considerations, it is recommended to dimension the enclosed area of the half-loop in such a manner that it is no larger than half the effective cross section of the surface of the sphere. The actual loop antenna, which, in principle, consists of the half-loop and its mirror image, thus has approximately the same effective cross section as the sphere.

In the text which follows, a particularly preferred embodiment of the invention will be described.

Figure 2:
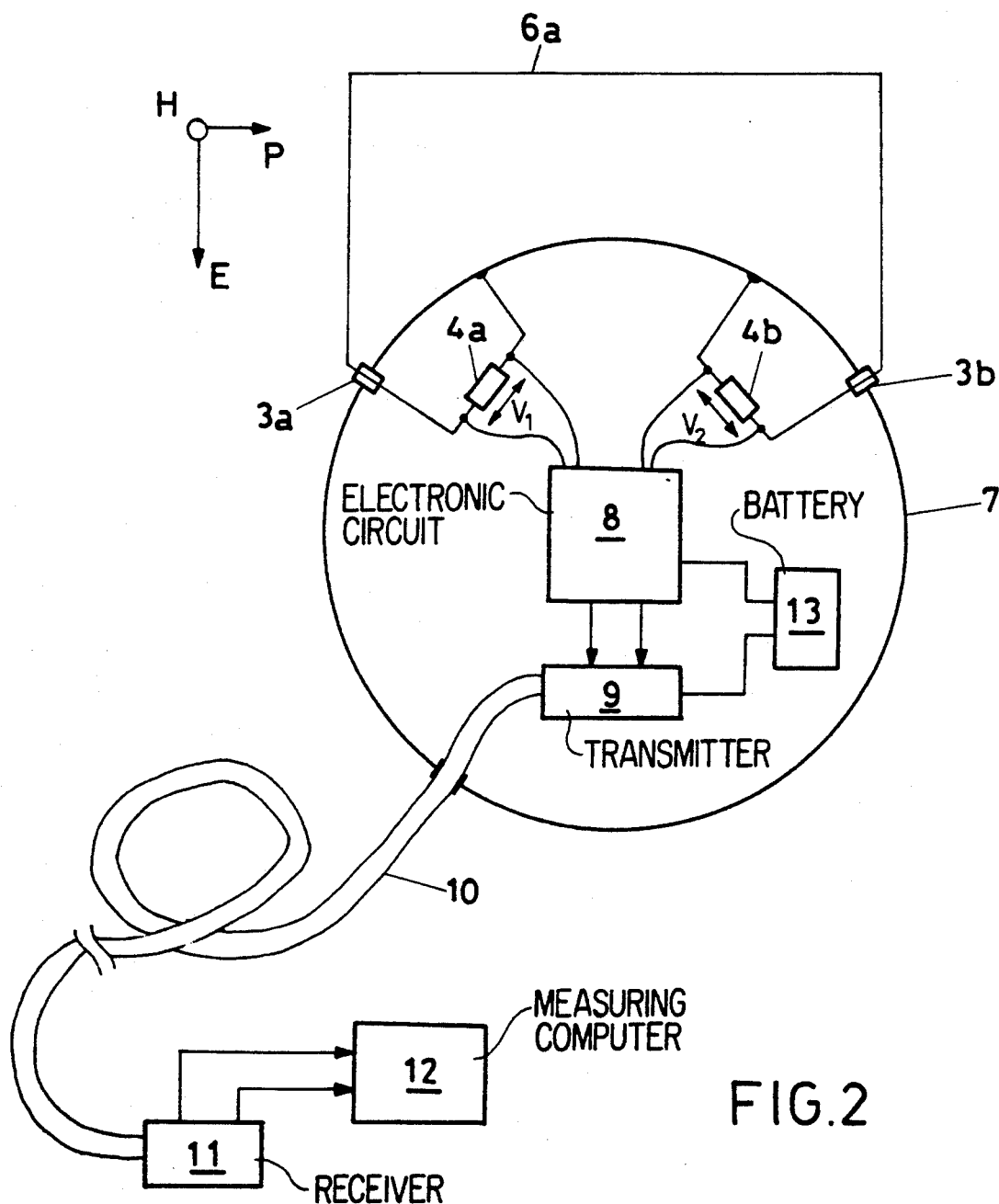
FIG. 2 shows a diagrammatic representation of the spherical field strength measuring instrument.

FIG. 2 shows a field strength measuring instrument which is particularly suitable for three-dimensional field measurements. For the sake of simplicity, however, only one loop antenna is shown. This is formed by a half-loop 6a and a sphere 7. The half-loop 6a preferably consists of a copper wire with a thickness of approximately 1-2 mm, which forms half a square. It thus has a long side and two short sides, the long side being about twice as long as one short side. The loop antenna detects the component of the E field which is parallel to the short sides. At the same time, the component of the H field is also determined which is perpendicular to the plane defined by the half-loop 6a (that is say perpendicular to the plane of the drawing in the present case). The orientation of the relevant components is shown in the conventional manner in FIG. 2 (top left).

The copper wire of the half-loop is passed in an insulated manner through the sphere 7 at two essentially diametrically opposite points (with respect to the equivalent full loop). Finally, the copper wire is connected (soldered) to the inside of the sphere 7 via one load resistor 4a, 4b in each case.

The coaxial feed-throughs 3a, 3b should preferably have about the same impedance as the load resistors 4a, 4b. It is known that the impedance of a coaxial line is the result of the relation:

$$Z_{coax} = \frac{60}{\ddot{Y}_r} \ln \frac{d_a}{d_i} \quad (I)$$

$d_a$ = inside diameter of the outer conductor (shield)
$d_i$ = outside diameter of the inner conductor (copper wire)
$\ddot{Y}_r$ = relative dielectric constant If, however, the diameter of the copper wire is 2 mm, the load resistor 200 ohms and the dielectric constant $\ddot{Y}_r=2$ (Teflon), the inside diameter $d_a$ would have to be approximately 22 cm for a matched impedance $Z_{coax}$. This value is too large for the present application.

For this reason, calculations were carried out, the aim of which was to estimate the error which arises if easily obtainable 50 ohm coaxial feed-throughs are used with load resistors within the preferred range of 50–1000 ohms. Analysis of the calculations led to the finding that even with feed-through lengths of 5 cm (worst conceivable case), the transformation of the load impedance at the (outer) entrance of the coaxial feed-through is small. The effect examined can even be neglected with load resistors of up to 200 ohms. The disturbing effect is correspondingly reduced with feed-through lengths of 1 cm, close to those used in practice.

Now back to FIG. 2 for the further description. The voltage $V_1$, $V_2$ present across the two load resistors 4a, 4b are picked off and processed by an electronic circuit 8, for example to form digital signals. These are sent via an optical transmission link known per se (so-called optolink) comprising a transmitter 9a, a fiber-optic cable 10 and a receiver 11, to a measuring computer 12.

The circuit 8 should be as small as possible and only carry out the signal processing necessary for the transmission. The minimum size of the interior space of the sphere is determined, as it were, by the energy needed for processing and transmission in the sphere. This is because the energy must be provided by a line-independent battery 13 which must be accommodated in the sphere itself and the volume of which depends on the magnitude of the power to be supplied.

The essential point with respect to the optolink and the battery lies in that the measuring probe (that is to say the sphere 7 with its half-loops and all its internal devices) are electrically completely isolated from other external measuring instruments. There must be no conductive connections (such as, for example, a coaxial cable) to the environment. This not only prevents hazardous induction loops but also interference influencing the field to be measured.

The measuring computer 12, which is preferably a portable computer, can be directed a long distance away (for example 100–1000 m) from the measuring site where the risk of interference due to the strong field to be measured (for example near-field of a transmitting antenna) is low. It can, for example, record (store) and analyze test series.

From the point of view of measurement technology, the electronic circuit 8 must meet high requirements. With a preferred measuring range from 75 kHz to 30 MHz, a diameter of approximately 15 cm is recommended for the sphere. Thus, the electronics must be rather small and have low losses. If field strengths within the range from 10–1200 V/m (about 40 dB) are to be measured, a dynamic range of approximately 92 dB must be expected due to the inductive characteristic of the loop antenna (20 dB per decade). Considering the small minimum signal levels (approximately 56 $\mu V$), the signals must be actively amplified. Finally, a measuring accuracy of, for example, 10% (1 dB) is desirable. It is thus clear that conventional active amplifiers will not produce the desired result.

Figure 3:
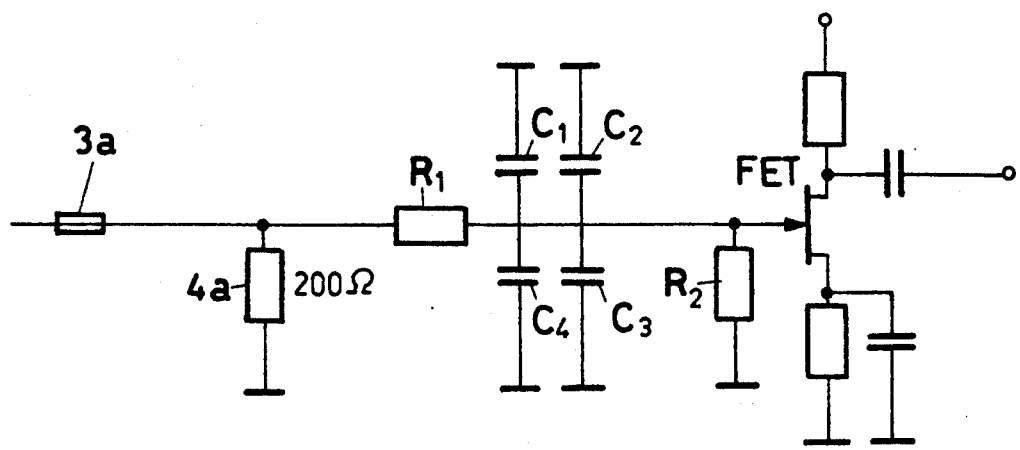
FIG. 3 shows a first-order low-pass filter for picking off the voltage present across the load resistor.

FIG. 3 shows then a preferred embodiment of a circuit for picking off a voltage $V_1$ and $V_2$, respectively, across the load resistor 4a and 4b, respectively. This is a first-order low-pass filter in the form of a high-impedance passive RC section. The sphere 7 is the ground for this circuit. The load resistor 4a has the preferred value of 200 ohms in the present example.

A resistor $R_1$ (for example 10 kohms) is connected between the coaxial feed-through 3a and the load resistor 4a. In comparison with the load resistor, the former resistor is of such a size that the input impedance is not significantly changed. $R_1$ is preferably at least 10 times larger than the load.

The C element of the low-pass filter comprises a plurality of parallel-connected capacitors $C_1, \ldots, C_4$ (for example 4 chip capacitors of between 50 and 100 pF). This is because it has been found that when a single relatively large chip capacitor is used, a resonance occurs at about 100 MHz which disturbingly influences the frequency response down to 30 MHz. This can be avoided by the division described. Although so-called feed-through capacitors are also available on the market which have a much higher resonant frequency than the chip capacitors and therefore appear to be more suitable, they are not only relatively large and expensive but also exhibit a stronger dependence on temperature than the chip capacitors.

So that the low-pass filter is not loaded too much and consequently its lower cut-off frequency raised in an unwanted manner, the first amplifier stage following the low-pass filter preferably exhibits a field-effect transistor (FET: for example junction FET) which not only has a high input impedance (>1 Mohm) but also excellent noise characteristics at low frequencies (<100 kHz).

The further signal processing depends on the user's requirements and the capabilities of the power supply (battery) and does not present any insurmountable problems.

Figure 4:
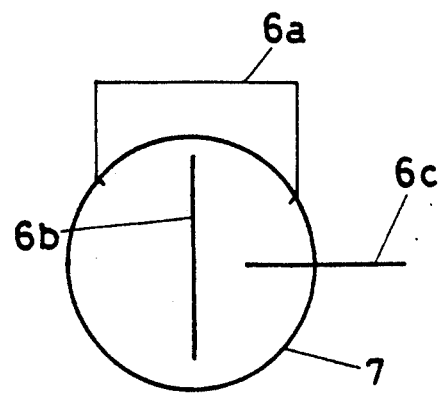
FIG. 4 shows a diagrammatic representation of the three-dimensional embodiment.

The great advantage of the spherical measuring probe lies in the fact that it allows both E and H field to be determined simultaneously and three-dimensionally. For this purpose, three half-loops 6a, 6b, 6c, which are orthogonal in pairs, are arranged on the outside of the sphere 7 (FIG. 4). Each of the three half-loops 6a, 6b, 6c, together with the sphere 7, forms a loop antenna which detects the components of the E and H field allocated to it.

The circuit 8 simultaneously processes not only two but six voltages (two per direction) and transmits these to the measuring computer via the optolink.

Naturally, the invention is not only suitable for measuring complex near fields in free space but also for measuring fields in waveguides such as, for example, the TEM cell with pyramidically expanding outer conductor, known from Patent Specification EP-0,246,544. In the text which follows, a preferred embodiment is described which is distinguished by its ruggedness.

Figure 5:
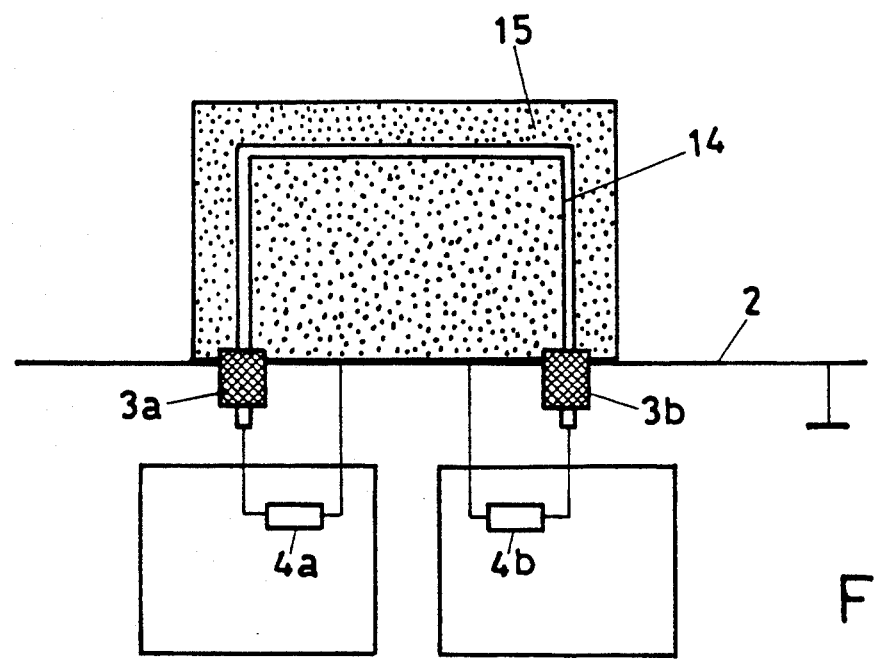
FIG. 5 shows a diagrammatic representation of a half-loop in the form of a printed conductor track.

FIG. 5 shows a diagrammatic representation of a half-loop in the form of a printed conductor track 14. A conventional insulating circuit board 15 can be used as carrier. In the case of a TEM cell measurement, the metal surface 2 is formed by the (grounded) outer conductor of the TEM cell, the half-loop naturally being located in the interior of the TEM cell but the circuit being located on the outside. In principle, coaxial feed-throughs 3a, 3b, load resistors 4a, 4b and all of the evaluating electronics are designed as described above. In particular, the statements with respect to the shape and area of the half-loop correspondingly apply to the conductor track 14. In contrast to the spherical probe, there are naturally no space problems with TEM cell measurements using the outer conductor as metal surface.

The statements made above show that the half-loop should be wire-shaped. This is intended to mean that it has the form of a long thin rod curved to form a semicircle, semisquare, semioctagon and so forth. The rod cross section should thus be much (for example 10 to 100 times) smaller than the diameter of the formed semicircle (or semisquare, semioctagon and so forth). The term "wire" must thus be interpreted in the widest conceivable sense (that is to say as a long, thin structure of a suitable material) and is in no way restricted to copper or metal wire.

The wideband characteristic of the loop antenna can be increased without reducing the loop diameter by means of a suitable choice of material. This can be achieved by using a material which has a certain loss. Instead of a metal half-loop, one of graphite or a (possibly doped) semiconductor material can thus be used, for example.

This principle is refined in a half-loop with location-dependent impedance. At the point where the current is highest on average, a higher impedance value is provided than at points of low current. The aim of the location-adapted impedance dimensioning should be to achieve as constant as possible a current distribution over the half-loop. This is because as soon as resonances occur, the desired linearity of the antenna characteristic disappears. A further advantage should arise from the fact that the signal levels are generally higher than with a simple metal half-loop with a predetermined upper cut-off frequency. This is because the loop diameter is allowed to be larger due to the damping means than in the undamped case because the loop reaches the region of resonance and thus the non-linear frequency range much less quickly.

The variable impedance can be achieved, for example, by a coated wire by means of which the local impedance value can be adjusted by the thickness of the coating (for example metal alloy). It is apparent that the increased or even locally matched impedance can also be easily implemented with the coated circuit board (FIG. 5).

In summary, the following can be stated: the invention has created the basis for implementing a novel field strength measuring instrument, with which the entire long wave, medium wave and short wave range (75 kHz to 30 MHz) can be covered with a high measuring accuracy. For the first time, it is possible to detect electrical and magnetic fields simultaneously and three-dimensionally with only one measuring probe and, as a result, to characterize near fields. The cost-intensive measuring time is already shortened by at least 50% merely by the simultaneous measurement of E and H field. The possibility of computerized control allows error-free and field-rated use even under difficult conditions. At very high field strengths, optimum personal protection is also ensured since the measurement data can be easily transmitted by fiber-optic cable up to 1000 m from the location of the sensor.

Obviously, numerous modifications and variations of the present invention are possible in light of the above teachings. It is therefore to be understood that, within the scope of the appended claims, the invention may be practiced otherwise than as specifically described herein.

List of designations 1, 5, 6a, 6b, 6c—half-loop; 2—metal surface; 3a, 3b—coaxial feed-throughs; 4a, 4b load resistor; 7—sphere; 8—circuit; 9—transmitter; 10—fiber-optic cable; 11—receiver; 12—measuring computer; 13—battery; 14—conductor track; 15—circuit board.

What is claimed as New and Desired to be secured by Letters Patent of the United States is:

1. A field strength measuring instrument comprising:
    an element having a conductive metal surface and defining a radiation measuring part-space exposed to E and H fields to be measured and a shielded part-space shielded by said metal surface from the field to be measured;
    a half-loop antenna disposed in said radiation measuring part-space and having opposed ends which are terminated via respective load resistors connected to said metal surface, said half-loop antenna in combination with said load resistors and said shielded surface producing a mirror image of said half-loop antenna to realize a closed loop antenna suitable for simultaneous detection of E and H fields existing in said radiation measuring part-space; and
    a circuit disposed in said shield part-space for determining the field strengths of the E and H fields by means of voltages induced by the E and H fields across the load resistors.

2. The field strength measuring instrument as claimed in claim 1, wherein the half-loop antenna is led through the metal surface at ends and is connected to the metal surface via the load resistors arranged in the shield part-space.

3. The field strength measuring instrument as claimed in claim 1, wherein the metal surface forms a curved surface closed in itself, which encloses the shielded part-space on all sides.

4. The field strength measuring instrument as claimed in claim 2 wherein the half-loop antenna essentially forms a part-section of a circle or of a regulator polygon.

5. The field strength measuring instrument as claimed in claim 1, wherein the two load resistors are essentially of the same size and have resistances of between 50 and 1000 ohms.

6. The field strength measuring instrument as claimed in claim 1, wherein a first-order low-pass filter with an input impedance ($R_1$) which is large compared with the load resistance and a C section divided into a plurality of parallel part-capacitors is connected in parallel to each load resistor for picking-off the respective voltages present across the load resistors.

7. The field strength measuring instrument as claimed in claim 1 wherein the metal surface is constructed as a spherical surface and three identical half-loop antenna which are orthogonally aligned in pairs, are arranged on the spherical surface so that E and H field can be vectorially determined at the same time.

8. The field strength measuring instrument as claimed in claim 7, wherein the half-loop antenna each enclose area which is not larger than half the effective cross section of the area of the sphere, and wherein the diameter of the sphere is smaller than half, especially less than or equal to one tenth, of the smallest wavelength of the E or H field to be measured.

9. The field strength measuring instrument claimed in claim 1, wherein the half-loop antenna is wire-shaped and has a diameter of more than 0.1 mm, particularly of at least 1 mm.

10. The field measuring instrument as claimed in claim 1 wherein the half-loop antenna is a conductor track applied to an insulating circuit board.

11. The field strength measuring instrument as claimed in claim 1 wherein the half-loop antenna essentially forms on of a square.

12. The field strength measuring instrument as claimed in claim 5, wherein the two load resistors have resistances between 100 and 300 ohms.

* * * * *